(12) United States Patent
Sai

(10) Patent No.: US 8,615,064 B2
(45) Date of Patent: Dec. 24, 2013

(54) PHASE LOCKED LOOP CIRCUIT AND RECEIVER USING THE SAME

(75) Inventor: Akihide Sai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1147 days.

(21) Appl. No.: 12/553,186

(22) Filed: Sep. 3, 2009

(65) Prior Publication Data

US 2010/0195779 A1 Aug. 5, 2010

(30) Foreign Application Priority Data

Feb. 4, 2009 (JP) .................................. 2009-024104

(51) Int. Cl.
*H03D 3/24* (2006.01)

(52) U.S. Cl.
USPC .......................................................... 375/376

(58) Field of Classification Search
USPC .......................................................... 375/376
See application file for complete search history.

(56) References Cited

U.S. PATENT DOCUMENTS

| | | | |
|---|---|---|---|
| 6,501,336 B2 | 12/2002 | Kim et al. | |
| 2006/0253244 A1 | 11/2006 | Matsuda | |

FOREIGN PATENT DOCUMENTS

| | | |
|---|---|---|
| JP | 2002-076886 | 3/2002 |
| JP | 2004-241960 | 8/2004 |
| JP | 2004-312726 | 11/2004 |
| JP | 2009-021954 | 1/2009 |

OTHER PUBLICATIONS

Staszewski, et al.; All-Digital PLL and Transmitter for Mobile Phones, IEEE Journal of Solid-State Circuits, vol. 40, No. 12, Dec. 2005, pp. 2469-2482.

Translation of the First Office Action for Patent Application No. 2009-024104 Dated Feb. 12, 2013, 4 pgs.

*Primary Examiner* — Chieh M Fan
*Assistant Examiner* — Tanmay Shah
(74) *Attorney, Agent, or Firm* — Turocy & Watson, LLP

(57) ABSTRACT

A phase locked loop circuit which obtains an output signal coincident in frequency and phase with a target signal which is acquired by multiplying the frequency of a reference signal by a ratio represented by the sum of a first fraction and a second fraction, the circuit includes a controlled oscillator including the same number of stages of annularly connected amplifiers as a number which is obtained by dividing, by 2, a least common multiple of a denominator of the first fraction, a denominator of the second fraction and 2, the same number of multiphase signals as the least common multiple being extractable from the controlled oscillator, the frequency of the multiphase signals being controlled by a digital control signal and an analog control signal, one of the multiphase signals being output as the output signal.

12 Claims, 7 Drawing Sheets

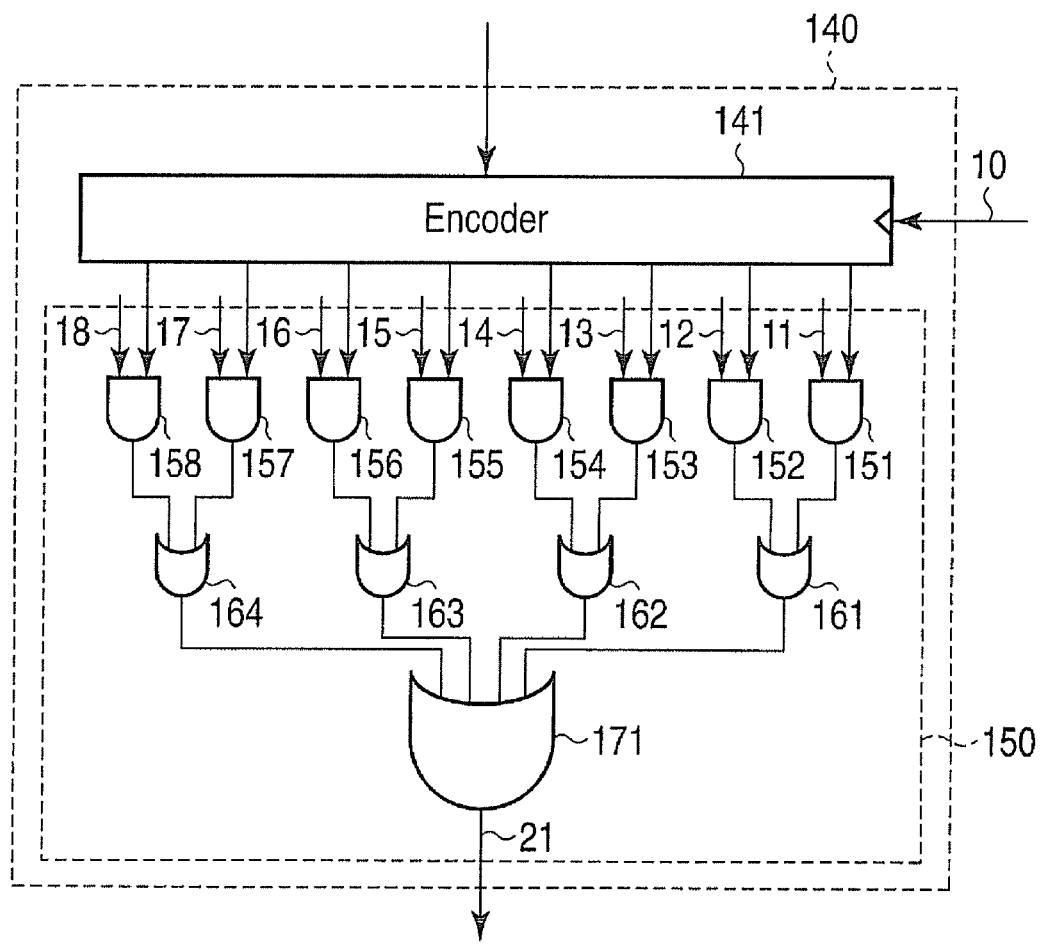
F I G. 3

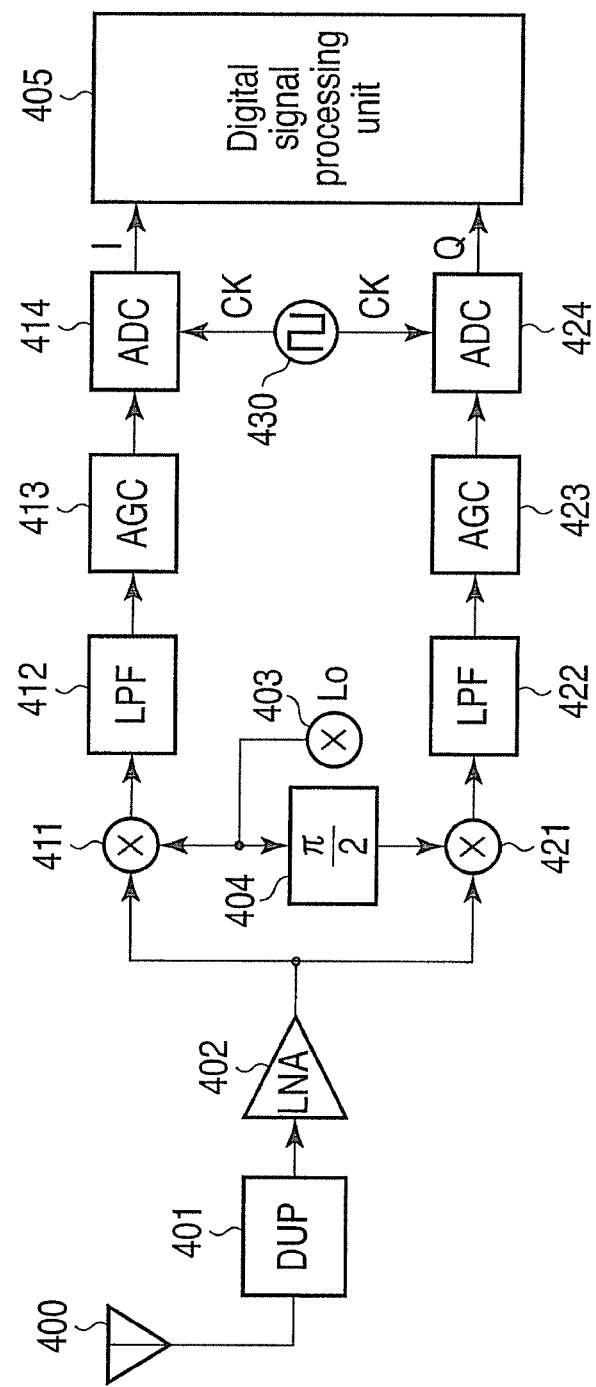
F I G. 7

PHASE LOCKED LOOP CIRCUIT AND RECEIVER USING THE SAME

CROSS-REFERENCE TO RELATED APPLICATIONS

This application is based upon and claims the benefit of priority from prior Japanese Patent Application No. 2009-024104, filed Feb. 4, 2009, the entire contents of which are incorporated herein by reference.

BACKGROUND OF THE INVENTION

1. Field of the Invention

The present invention relates to a phase locked loop (PLL) circuit and a receiver using the same.

2. Description of the Related Art

A phase locked loop circuit is used to obtain an output signal synchronized (locked) in frequency and phase with a target signal which is acquired by multiplying the frequency of a reference signal by a desired ratio. A typical PLL includes a voltage controlled oscillator (VCO) whose oscillating frequency is controlled in accordance with a given control voltage, an analog phase detector for detecting a phase difference between the reference signal and the output signal of the VCO, an analog filter for removing unnecessary waves from the output signal of the analog phase detector, and an amplifier for amplifying the output signal of the analog filter to generate the control voltage.

The PLL is not limited to the above-mentioned analog form, and may be in digital form. [R. Staszewski, "ALL-Digital PLL and Transmitter for Mobile Phones", IEEE J. of Solid-State Circuits Vol. 40, No. 12, DEC 2005.] (hereinafter simply referred to as a related art) describes a digital PLL. This PLL includes a VCO, a time to digital converter (TDC) for detecting a frequency difference and a phase difference between a reference signal and the output signal of the VCO to output a digital detection signal corresponding to the frequency difference and the phase difference, a digital filter for performing filter processing of smoothing the digital detection signal, and a digital-analog converter (DAC) for converting the output signal of the digital filter to generate a control voltage of the VCO. While the analog PLL uses the analog filter including an external capacitor, the digital PLL is capable of replacing the analog filter with an on-chip digital filter. It is known that the digital PLL can thus be configured with a smaller area than the analog PLL.

However, as the TDC converts the frequency difference and the phase difference into a digital detection signal, quantization noise is generated. Since the resolution of the TDC is finite, quantization noise corresponding to one least significant bit (LSB) might be generated even in a locked (synchronized) state. The transfer function of the quantization noise to a PLL output is a low-pass type, and the cutoff frequency thereof depends on a loop band. On the other hand, the transfer function of the phase noise generated in the VCO to the PLL output is a high-pass type, and the cutoff frequency thereof depends on the loop band. Thus, if a narrow loop band is set to remove the quantization noise, the phase noise of the VCO is not easily removed. On the other hand, if a broad loop band is set to remove the phase noise of the VCO, the quantization noise is not easily removed.

JP-A 2004-312726 (KOKAI) describes a double-loop PLL including a digital loop for frequency lock, and an analog loop for phase lock. The PLL described in JP-A 2004-312726 (KOKAI) sets a narrow loop band of the digital loop to remove the quantization noise and sets a relatively broad loop band of the analog loop to remove the phase noise of the VCO.

In general, if the frequency ratio between the target signal and the reference signal is an integral number, a PLL can be relatively easily configured by use of an integral divider having a division ratio coincident with the above the frequency ratio. However, considering recent technical demands, it is desirable that the frequency ratio be not limited to an integral number but be extended to a fractional number. For example, a fractional N-PLL switches the division ratio (integral number) of a variable divider between two or more values to obtain a pseudo fractional division ratio.

Generation of unnecessary waves called a fractional spurious is one disadvantage of the fractional N-PLL. Even if the double-loop PLL described in JP-A 2004-312726 (KOKAI) is simply combined with the fractional N-PLL, the generation of the fractional spurious is unavoidable.

BRIEF SUMMARY OF THE INVENTION

According to an aspect of the invention, there is provided a phase locked loop circuit which obtains an output signal coincident in frequency and phase with a target signal which is acquired by multiplying the frequency of a reference signal by a ratio represented by the sum of a first fraction and a second fraction, the circuit comprising: a controlled oscillator including the same number of stages of annularly connected amplifiers as a number which is obtained by dividing, by 2, a least common multiple of a denominator of the first fraction, a denominator of the second fraction and 2, the same number of multiphase signals as the least common multiple being extractable from the controlled oscillator, the frequency of the multiphase signals being controlled by a digital control signal and an analog control signal, one of the multiphase signals being output as the output signal; a converter which converts a frequency difference and a phase difference between the output signal and the reference signal to a first digital signal; a digital phase frequency detector which subtracts the first digital signal from a second digital signal representing the ratio and obtains a third digital signal representing a frequency difference and a phase difference between the output signal and the target signal; a digital filter which performs filter processing of smoothing the third digital signal to generate the digital control signal; a signal selector which sequentially selects, from the multiphase signals at every period of the reference signal in accordance with the first digital signal, a signal in phase with the reference signal in a next period as a selected signal; an analog phase detector which obtains an analog phase difference signal representing a phase difference between the selected signal and the reference signal; an analog filter which performs filter processing of smoothing the analog phase difference signal to generate the analog control signal; and a lock detector which switches signal paths for the analog control signal so that the analog control signal is provided to the controlled oscillator when the lock detector detects in accordance with the third digital signal that the output signal and the target signal are coincident in frequency and phase.

According to another aspect of the invention, there is provided a phase locked loop circuit which obtains an output signal coincident in frequency and phase with a target signal which is acquired by multiplying the frequency of a reference signal by a ratio represented by the sum of a first fraction and a second fraction, the circuit comprising: a controlled oscillator including the same number of stages of annularly connected amplifiers as a number which is obtained by dividing, by 2, a least common multiple of a denominator of the first fraction, a denominator of the second fraction and 2, the same number of multiphase signals as the least common multiple being extractable from the controlled oscillator, the frequency of the multiphase signals being controlled by a digital control signal and an analog control signal, one of the multiphase signals being output as the output signal; a converter which converts a frequency difference and a phase difference between the output signal and the reference signal to a first digital signal; a digital phase frequency detector which subtracts the first digital signal from a second digital signal representing the ratio and obtains a third digital signal representing a frequency difference and a phase difference between the output signal and the target signal; a digital filter which performs filter processing of smoothing the third digital signal to generate the digital control signal; a signal selector which sequentially selects, from the multiphase signals at every period of the reference signal in accordance with the first digital signal, a signal in phase with the reference signal in a next period as a first selected signal, a signal whose phase is ahead the phase of the first selected signal as a second selected signal, and a signal whose phase is behind the phase of the first selected signal as a third selected signal; an analog phase detector which obtains a first analog signal representing a phase difference between one of the second and third selected signals and the reference signal, and a second analog signal representing a phase difference between the other of the second and third selected signals and the first selected signal; an analog filter which performs filter processing of smoothing the first analog signal and the second analog signal to generate the analog control signal; and a lock detector which switches signal paths for the analog control signal so that the analog control signal is provided to the controlled oscillator when the lock detector detects in accordance with the third digital signal that the output signal and the target signal are coincident in frequency and phase.

BRIEF DESCRIPTION OF THE SEVERAL VIEWS OF THE DRAWING

FIG. 3 is a block diagram showing one example of a signal selector in FIG. 1;

FIG. 7 is a block diagram showing a receiver according to a fourth embodiment.

DETAILED DESCRIPTION OF THE INVENTION

Embodiments of the present invention will hereinafter be described with reference to the drawings.

First Embodiment

Figure 1:
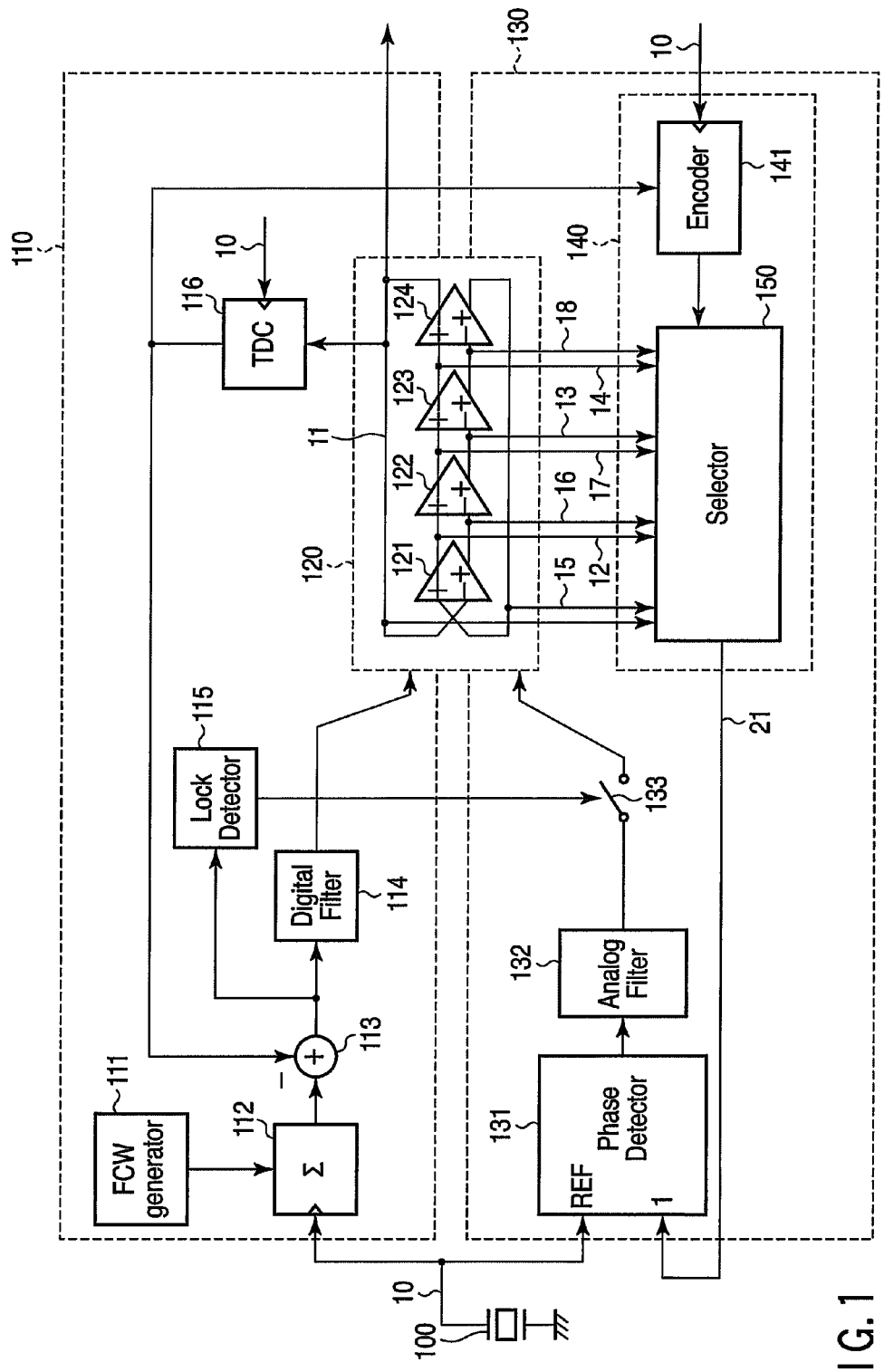
FIG. 1 is a block diagram showing a phase locked loop circuit according to a first embodiment.

As shown in FIG. 1, a phase locked loop circuit according to a first embodiment of the present invention includes a frequency command word (FCW) generator 111, a counter 112, a digital phase frequency detector 113, a digital filter 114, a lock detector 115, a TDC 116, a controlled oscillator 120, an analog phase detector 131, an analog filter 132, a switch 133 and a signal selector 140.

The FCW generator 111, the counter 112, the digital phase frequency detector 113, the digital filter 114, the controlled oscillator 120 and the TDC 116 constitute a digital loop 110. The digital loop 110 is a loop for locking the frequency and phase of a first phase signal 11 output from the later-described controlled oscillator 120 to a target signal (hereinafter simply referred to as a lock target signal) designated as a lock target by the phase locked loop circuit in FIG. 1.

The analog phase detector 131, the analog filter 132, the switch 133, the controlled oscillator 120 and the signal selector 140 constitute an analog loop 130. The analog loop 130 is a loop for maintaining a locked state acquired by the function of the digital loop 110 and for removing, over a broad band, quantization noise generated by the digital loop 110 and phase noise of the controlled oscillator 120. A broader loop band is desirably set in the analog loop 130 than in the digital loop 110.

That is, the phase locked loop circuit in FIG. 1 removes, over a broad band, the quantization noise and the phase noise generated in the controlled oscillator 120 by the combination of the narrow-band digital loop 110 and the broad-band analog loop 130.

The FCW generator 111 inputs, to the counter 112, an FCW which is a digital code for specifying a frequency ratio of the lock target signal to a reference signal 10. That is, the frequency of the lock target signal is equal to a value obtained by multiplying the frequency of the reference signal 10 by the FCW. The FCW is artificially or automatically set. The FCW may include not only an integral part but also a decimal part.

The counter 112 uses the reference signal 10 as a clock signal, and counts the FCWs output from the FCW generator 111. The counter 112 inputs a count value to the digital phase frequency detector 113.

The digital phase frequency detector 113 subtracts the digital signal input from the later-described TDC 116 from the count value from the counter 112, and inputs a digital detection signal indicating a frequency difference and a phase difference between the lock target signal and the first phase signal 11 to the digital filter 114 and the TDC 116.

The digital filter 114 performs filter processing of smoothing the digital phase frequency detector 113 to generate a digital control signal. The frequency characteristic of the digital filter 114 influences the loop band and lockup time of the digital loop 110, the phase noise characteristic of the controlled oscillator 120, etc., and is therefore desirably set in a suitable manner. The digital filter 114 provides the digital control signal to a later-described digital control terminal of the controlled oscillator 120.

The controlled oscillator 120 is a so-called ring oscillator constituted of a plurality of stages of annularly connected amplifiers. Although the controlled oscillator 120 is constituted of a total of four stages of annularly connected amplifiers including an amplifier 121, an amplifier 122, an amplifier 123 and an amplifier 124 for the simplification of explanation, the number of stages of the amplifiers constituting the controlled oscillator 120 is not limited to this. The controlled oscillator 120 has the digital control terminal and an analog control terminal. The oscillation frequency of the controlled oscillator 120 (i.e., the frequency of the first phase signal 11) is controlled by the combination of the digital control signal provided to the digital control terminal and an analog control signal provided to the analog control terminal. The controlled oscillator 120 is capable of extracting the number of multiphase signals corresponding to the number of stages of the amplifiers. The multiphase signals have the common frequency (i.e., the oscillating frequency of the controlled oscillator 120). In the example of FIG. 1, the controlled oscillator 120 is capable of extracting an eight-phase signal, so that the first phase signal 11, a second phase signal 12, . . . , an eighth phase signal 18 are extracted. In FIG. 1, the first phase signal 11, the second phase signal 12, . . . , the eighth phase signal 18 are differentiated by assigning numbers in the order of phase delays for convenience. The phase of the first phase signal 11 is $\pi/4$ [rad] ahead the phase of the second phase signal 12, and is $7\pi/4$ [rad] ahead the phase of the eighth phase signal 18. That is, if i is an integral number equal to or less than 7, the phase difference between the i-th phase signal and the (i+1)-th phase signal is constant ($=2\pi/8$ [rad]=$\pi/4$ [rad]). All of the first phase signal 11, . . . , the eighth phase signal 18 that have been extracted from the controlled oscillator 120 are input to the signal selector 140. Moreover, the first phase signal 11 is also input to the TDC 116, and further output as an output signal of the phase locked loop circuit.

The number of stages of the amplifiers constituting the controlled oscillator 120 is determined by the resolution of the FCW generated by the FCW generator 111. Given that the FCW is represented by the sum of two positive fractions as indicated by Expression (1) below:

$$FCW = \left(\frac{L}{J} + \frac{M}{K}\right) \quad (1)$$

In Expression (1), L represents an integral number equal to or more than 0, and J, K and M represent natural numbers. Moreover, by way of example, L, J and K may be fixed numbers, and M may be a variable value. In this case, the number of stages of the amplifiers constituting the controlled oscillator 120 is LCM{J, K}×I (I represents a given natural number) if the least common multiple LCM{J, K} of J and K is an odd number, or LCM{J, K}×I/2 if the least common multiple LCM{J, K} is an even number. In other words, the above number of stages includes, in a divisor, a number obtained by further dividing the least common multiple of J, K and 2 by 2. Then, the number of multiphase signals which include the above least common multiple in the divisor need to be extracted from the controlled oscillator 120.

Thus, when the number of stages of the amplifiers constituting the controlled oscillator 120 is minimized (i.e., I=1), it is necessary to extract at least multiphase signals equal to the number of stages×2. If the amplifiers are balanced differential amplifiers, multiphase signals equal to the number of stages×2 can be extracted by simply extracting output signals of the respective stages. If the amplifiers are single-phase amplifiers or single-end differential amplifiers, the output signal of each stage is extracted and further divided into two parts, and one of them is extracted as it is while the other is extracted via an inverter, such that multiphase signals equal to the number of stages×2 can be extracted.

The TDC 116 uses the reference signal 10 as a clock signal, and generates a digital signal representing the frequency difference and the phase difference between the reference signal 10 and the first phase signal 11. The TDC 116 may have a configuration that detects the phase difference on the basis of an inverter delay as disclosed in, for example, the related art. The TDC 116 inputs the digital signal representing the frequency difference and the phase difference to the signal selector 140 and the digital phase frequency detector 113. The digital signal output by the TDC 116 is, for example, a so-called thermometer code.

The lock detector 115 detects the locked state on the basis of the digital detection signal from the digital phase frequency detector 113. For example, if the value of the digital detection signal is 0, the lock detector 115 detects the locked state. When detecting the locked state, the lock detector 115 turns on the switch 133 to ensure a signal path for the analog control signal, and shifts the analog loop 130 to an active state.

The signal selector 140 uses the reference signal 10 as a clock signal, and selects one of the multiphase signals (the first phase signal 11, . . . , the eighth phase signal 18 in FIG. 1) from the controlled oscillator 120 in accordance with the digital signal from the TDC 116, and then inputs the selected signal as a first selected signal 21 to the analog phase detector 131. Here, the first selected signal is a signal in phase with (i.e., its rising edge or falling edge coincides with) the reference signal 10 in the next period of the reference signal 10.

The analog phase detector 131 detects a phase difference between the first selected signal 21 from the signal selector 140 and the reference signal 10, and inputs the phase difference to the analog filter 132 as an analog phase difference signal. Although the specific configuration of the analog phase detector 131 is not particularly mentioned, a simple configuration using an XOR gate will suffice because the first selected signal 21 and the reference signal 10 are in phase as described above.

The analog filter 132 performs filter processing of smoothing the analog phase difference signal from the analog phase detector 131, and thereby generates the analog control signal. The switch 133 is provided between the analog filter 132 and the analog control terminal of the controlled oscillator 120. The on/off of the switch 133 is controlled by the lock detector 115 as described above. That is, if the first phase signal 11 is locked to the lock target signal by the function of the digital loop 110, the analog control signal is provided to the analog control terminal of the controlled oscillator 120 via the switch 133.

The signal selector 140 is described below in detail.

The signal selector 140 has an encoder 141 and a selector 150. The encoder 141 uses the reference signal 10 as a clock signal, and generates a selection control signal for controlling the selector 150 on the basis of the digital signal from the TDC 116. Here, the selection control signal is a signal for specifying a signal in phase with the reference signal 10 in the next period of the reference signal 10. Then, the selector 150 selects the first selected signal 21 in accordance with the selection control signal from the encoder 141, and inputs the first selected signal 21 to the analog phase detector 131.

The signal selector 140 is configured, for example, as shown in FIG. 3. In FIG. 3, the selector 150 has AND gates 151, . . . , 158, and OR gates 161, . . . , 164, 171. The first phase signal 11, . . . , the eighth phase signal 18 are input to the AND gates 151, . . . , 158, respectively. In this case, the selection control signal is a signal of a total of 8 bits which is input bit by bit to the AND gates 151, . . . , 158. In accordance with the digital signal (e.g., the thermometer code) from the TDC 116, the encoder 141 generates a selection control signal (bubble code) whereby the bit corresponding to the AND gate to which a signal to be specified as the first selected signal 21 is input is set at "1" while the bits corresponding to the other AND gates are set at "0". Then, the OR of the output signals of the eight AND gates 151, . . . , 158 is calculated by the OR gates 161, . . . , 164, 171, and one signal specified by the selection control signal is output as the first selected signal 21.

Figure 2:
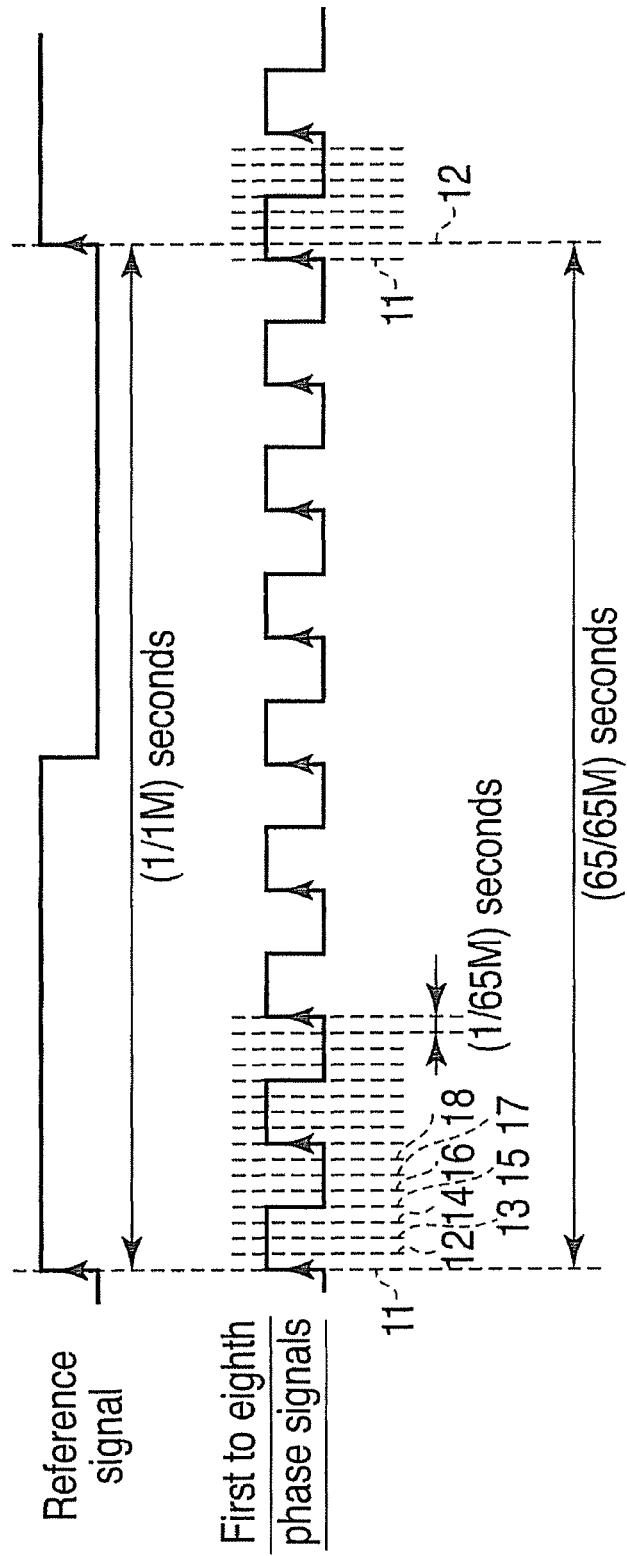
FIG. 2 is a diagram of one example of a timing chart of a reference signal and a multiphase signal in the phase locked loop circuit in FIG. 1.

Provided that the frequency of the reference signal 10 is 1 MHz (period=1/1 [μsec]) and that the FCW is (8/1+1/8). In this case, the frequency of the lock target signal is 65/8 MHz (period=8/65 [μsec]). Moreover, the minimum time resolution of the controlled oscillator 120 is 1/65 [μsec] which is obtained by dividing the period of the output signal (=the period of the lock target signal) by the number of multiphase signals. That is, one period of the reference signal 10 corresponds to 65 minimum time resolutions. Therefore, as shown in FIG. 2, if the rising edge of the reference signal 10 is coincident with the rising edge of the first phase signal 11 at some point, the next rising edge of the reference signal 10 is coincident with the rising edge of the second phase signal 12. Subsequently, the rising edge of the reference signal 10 coincides with the rising edge of one of the first phase signal 11, . . . , the eighth phase signal 18 in the same manner. That is, the signal selector 140 is capable of always selecting the first selected signal 21 in phase with the reference signal 10.

Furthermore, even if M is a variable value in Expression (1), the signal selector 140 is capable of always selecting the first selected signal 21 in phase with the reference signal 10. For example, provided that the frequency of the reference signal 10 is 1 MHz (period=1/1 [μsec]) and that the FCW is (16/3+M/5). In this case, as described above, the number of stages of the amplifiers constituting the controlled oscillator 120 has only to be 15, and the number of multiphase signals has only to be 30. The frequency of the lock target signal is (80+3M)/15 MHz (period=15/(80+3M) [μsec]). Moreover, the minimum time resolution of the controlled oscillator 120 is 1/(160+6M) [μsec] which is obtained by dividing the period of the output signal (=the period of the lock target signal) by the number of multiphase signals. For example, if M=1, the minimum time resolution is 1/166 [μsec]. Thus, one period of the reference signal 10 corresponds to 166 minimum time resolutions. As one period of the output signal (=lock target signal) of the controlled oscillator 120 corresponds to 30 (=the number of multiphase signals) minimum time resolutions, the signal selector 140 has only to sequentially select the first selected signal 21 so that the phase shifts by 16 (=166 mod 30) minimum time resolutions. Moreover, if M is generalized, the signal selector 140 has only to sequentially select the first selected signal 21 so that the phase shifts by {(160+M)mod 30} minimum time resolutions.

A phase shift amount step of the phase signal sequentially selected by the signal selector 140 as the first selected signal 21 can be derived by Expression (2) below:

$$\text{step} = \left\{\left(\frac{L}{J} + \frac{M}{K}\right) \times LCM\{2, LCM(J, K)\} \times I\right\} \bmod (LCM\{2, LCM(J, K)\} \times I) \quad (2)$$

One step is a phase [rad] obtained by dividing $2\pi$ by the least common multiple of J, K and 2. That is, in the example of FIG. 1, one step is $\pi/4$ [rad]. Even if M changes, the signal selector 140 can continue to select the proper first selected signal 21 simply by recalculating the step.

As described above, in the phase locked loop circuit according to the present embodiment, the lock target signal is locked by the function of the digital loop, and then a signal in phase with the reference signal is sequentially selected from the multiphase signals extracted from the controlled oscillator and provided to a phase detector in the analog loop, thereby maintaining the locked state. Thus, according to the phase locked loop circuit of the present embodiment, even if the frequency ratio of the lock target signal to the reference signal is a fractional value, no fractional spurious is generated, and the quantization noise and the phase noise of the oscillator can be removed over a broad band.

Second Embodiment

Figure 4:
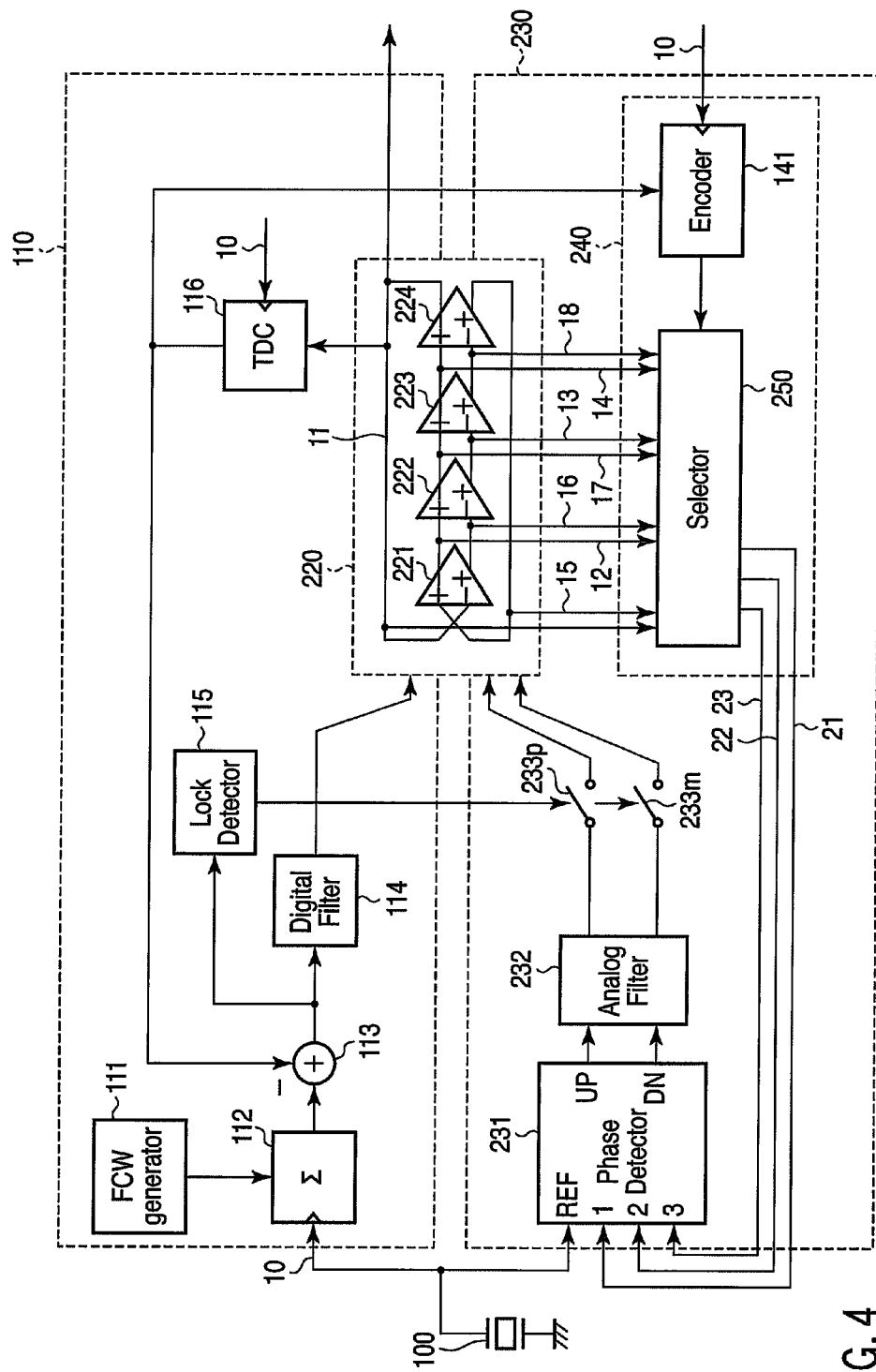
FIG. 4 is a block diagram showing a phase locked loop circuit according to a second embodiment.

As shown in FIG. 4, in a phase locked loop circuit according to a second embodiment of the present invention, the analog loop 130 in the phase locked loop circuit shown in FIG. 1 is replaced with an analog loop 230. The same signs are provided to the same parts in FIG. 4 as the parts in FIG. 1, and different parts are mainly described below.

The analog loop 230 is composed of an analog phase detector 231, an analog filter 232, a switch 233p, a switch 233m, a controlled oscillator 220 and a signal selector 240.

The controlled oscillator 220 includes an analog differential control terminal in place of the above-described analog control terminal in the controlled oscillator 120. The controlled oscillator 220 has its oscillating frequency controlled in accordance with the combination of a digital control signal input to a digital control terminal and an analog differential control signal input to the analog differential control terminal. The controlled oscillator 220 outputs multiphase signals (a first phase signal 11, . . . , an eighth phase signal 18).

The signal selector 240 has a selector 250 and an encoder 141. The selector 250 selects a first selected signal 21 in accordance with a selection control signal input from the encoder 141. Moreover, the selector 250 further selects a second selected signal 22 whose phase is a predetermined amount ahead the phase of the first selected signal 21, and a third selected signal 23 whose phase is a predetermined amount behind the phase of the first selected signal 21. Here, the phase difference between the first selected signal 21 and the second selected signal 22 is desirably equal to the phase difference between the first selected signal 21 and the third selected signal 23. Moreover, the phase difference is desirably greater than the width of a later-described dead zone of the analog phase detector 231. The dead zone means the minimum phase difference which can be detected by a phase detector or phase frequency detector generally included in a PLL. The dead zone is generated by a logical delay in the phase detector or the phase frequency detector, and causes the deterioration of the phase noise characteristic of the whole PLL. The signal selector 240 inputs the first selected signal 21, the second selected signal 22 and the third selected signal 23 to the analog phase detector 231.

The analog phase detector 231 generates an UP signal and a DOWN signal by use of the first selected signal 21, the second selected signal 22 and the third selected signal 23 from the signal selector 240 and by use of a reference signal 10 from a reference signal generator. Specifically, the analog phase detector 231 generates the UP signal indicating the phase difference between the reference signal 10 and the third selected signal 23, and the DOWN signal indicating the phase difference between the first selected signal 21 and the second selected signal 22.

Figure 5:
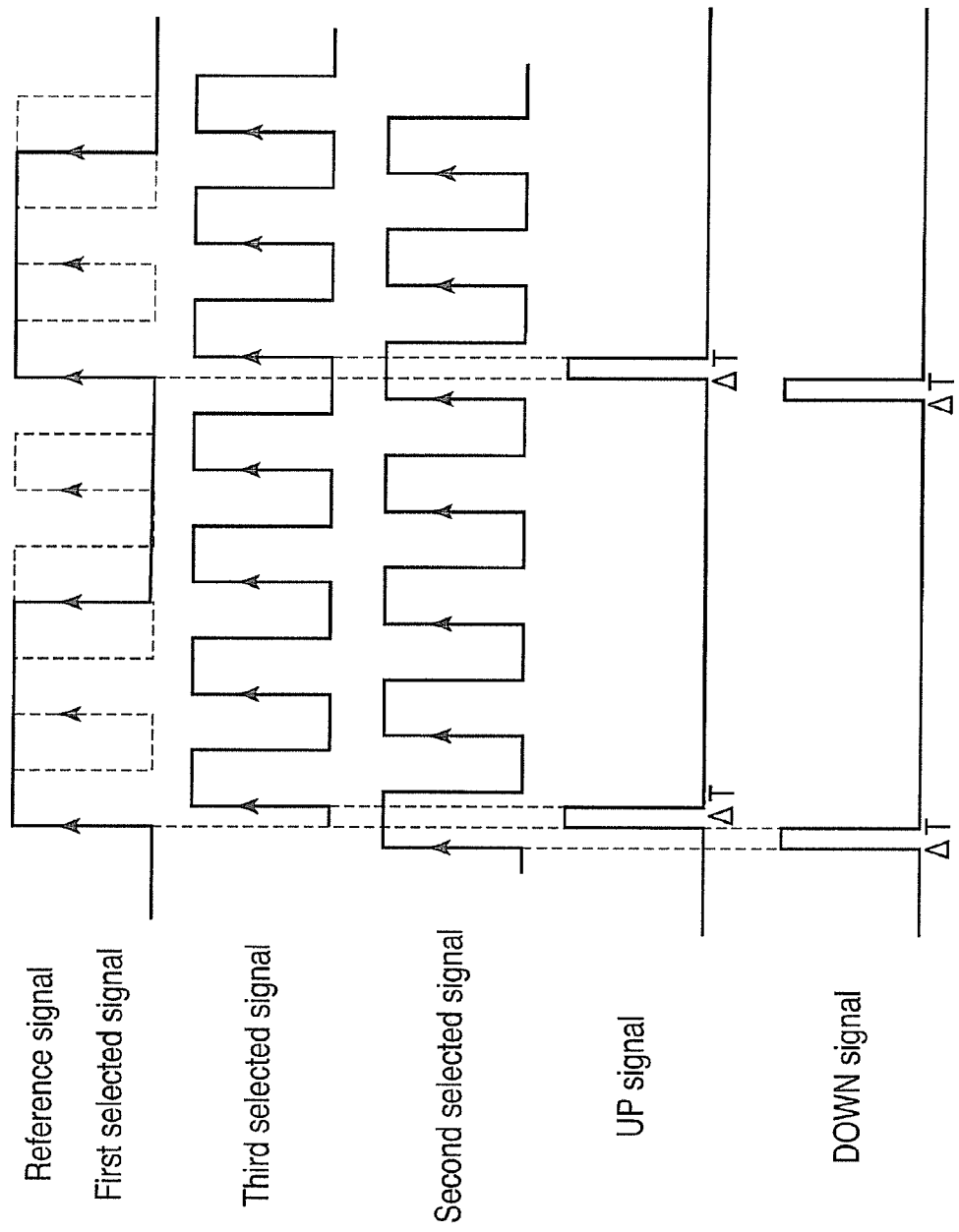
FIG. 5 is a diagram of one example of a timing chart of various signals in the phase locked loop circuit in FIG. 4.

For example, as shown in FIG. 5, the UP signal is a pulse indicating the time difference of rising edges between the reference signal 10 and the third selected signal 23, and the DOWN signal is a pulse indicating the time difference of rising edges between the first selected signal 21 and the second selected signal 22. If the phase of the first phase signal 11 is locked to the phase of a lock target signal, the first selected signal 21 and the reference signal 10 are in phase. Thus, in a locked state, the pulse widths of the UP signal and the DOWN signal are equal. Here, if the first phase signal 11 starts to be out of phase with the lock target signal due to disturbance such as a temperature variation or noise, the pulse width of the DOWN signal does not change, but the pulse width of the UP signal changes. Then, the analog differential control signals are sequentially generated by the analog filter 232 so that the dephasing of the first phase signal 11 may be reduced (i.e., the pulse width of the UP signal may be closer to the pulse width of the DOWN signal) by the function of a negative loop in the analog loop 230, thereby controlling the controlled oscillator 220.

In addition, the switch 233p and the switch 233m are provided between the analog filter 232 and the controlled oscillator 220. The switch 233p and the switch 233m are on during a period in which a lock detector 115 detects a phase lock similarly to the switch 133, and are off during other periods.

As described above, the analog phase detector in the phase locked loop circuit according to the present embodiment detects the phase difference between the first selected signal and the second selected signal and the phase difference between the reference signal and the third selected signal, without detecting the phase difference between the first selected signal and the reference signal. Thus, according to the phase locked loop circuit of the present embodiment, even when the phase difference between the first selected signal and the reference signal is smaller than the width of the dead zone of the analog phase detector, the phase locking of the first phase signal to the lock target signal can be maintained (i.e., the phase noise characteristic is good). In addition, the second selected signal and the third selected signal may be interchanged. Moreover, instead of the time difference of the rising edges, the time difference of falling edges may serve for the UP signal and the DOWN signal.

Third Embodiment

Figure 6:
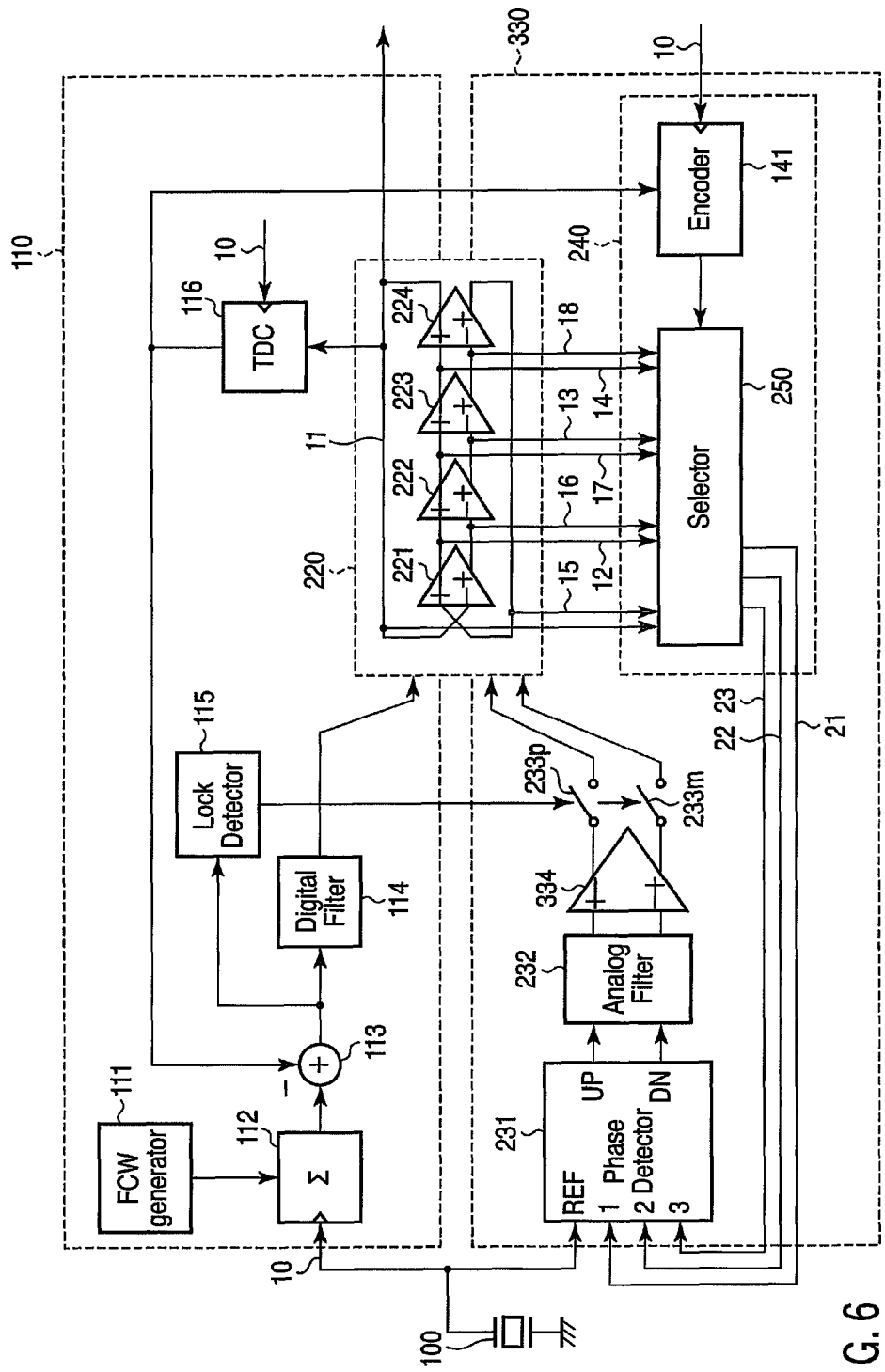
FIG. 6 is a block diagram showing a phase locked loop circuit according to a third embodiment.

As shown in FIG. 6, in a phase locked loop circuit according to a third embodiment of the present invention, the analog loop 230 in the phase locked loop circuit shown in FIG. 4 is replaced with an analog loop 330. The same signs are provided to the same parts in FIG. 6 as the parts in FIG. 4, and different parts are mainly described below.

The analog loop 330 is composed of an analog phase detector 231, an analog filter 232, an amplifier 334, a switch 233p, a switch 233m, a controlled oscillator 220 and a signal selector 240. That is, the analog loop 330 has a configuration in which the amplifier 334 is further provided between the analog filter 232 and the switches 233p and 233m in the above-described analog loop 230 in FIG. 4.

The amplifier 334 is a balanced differential amplifier having an inverting input terminal, a noninverting input terminal, an inverting output terminal and a noninverting output terminal. A differential signal obtained by amplifying the level of the differential signal input from the analog filter 232 is provided, as a differential control circuit, to an analog control terminal of the controlled oscillator 220 via the switch 233p and the switch 233m.

As the amplifier 334 amplifies the level of a differential control signal provided to the controlled oscillator 220, the loop band of the analog loop 330 is greater than the loop band of the above-described analog loop 230. Moreover, the balanced amplifier is used as the amplifier 334, so that the effect of suppressing the sensitivity of the analog loop 330 to the common mode noise can also be obtained. In addition, even if the amplifier 334 is replaced with a single-phase amplifier or a single-end differential amplifier, the loop band can be broad.

As described above, in the phase locked loop circuit of the present embodiment, the balanced differential amplifier for amplifying the level of the differential control signal is further provided in the phase locked loop circuit according to the second embodiment described above. Thus, according to the phase locked loop circuit of the present embodiment, the loop band of the analog loop can be broader and the sensitivity to the phase noise can be more suppressed than in the phase locked loop circuit according to the second embodiment described above.

Fourth Embodiment

As shown in FIG. 7, a receiver according to a fourth embodiment of the present invention includes an antenna 400, a duplexer 401, a low noise amplifier (LNA) 402, a local oscillator 403, a phase shifter 404, a digital signal processing unit 405, a mixer 411, an LPF 412, an automatic gain control (AGC) circuit 413, an analog-digital converter (ADC) 414, a mixer 421, an LPF 422, an ADC 424 and a clock generating circuit 430.

The antenna 400 receives a radio-frequency (RF) signal, and inputs this RF signal to the duplexer 401. The duplexer 401 removes unnecessary waves from the RF signal, and inputs the resultant RF signal to the LNA 402. The LNA 402 amplifies the level of the RF signal from the duplexer 401, and inputs the resultant RF signal to the mixer 411 and the mixer 421.

The local oscillator 403 generates a local signal for down-converting the RF signal, and supplies the local signal to the mixer 411 and the phase shifter 404. The phase shifter 404 phase-shifts, 90 degrees ($\pi/2$ [rad]), the local signal from the local oscillator 403, and inputs the resultant local signal to the mixer 421.

The mixer 411 multiplies the RF signal from the LNA 402 and the local signal from the local oscillator 403 to generate an I signal. Further, the mixer 421 multiplies the RF signal and the local signal phase-shifted by the phase shifter 404 to generate a Q signal.

Low-frequency components in the I signal generated by the mixer 411 and the Q signal generated by the mixer 421 are extracted by the LPF 412 and the LPF 422, and the levels of these signals are adjusted by the AGC 413 and an AGC 423. The ADC 414 and the ADC 424 sample the I signal and the Q signal in accordance with a sampling clock generated by the clock generating circuit 430, and thus convert these signals to digital values, and then input the digital values to the digital signal processing unit 405. The clock generating circuit 430 is configured by the phase locked loop circuit according to any one of the first to third embodiments described above.

The digital signal processing unit 405 is configured by, for example, a digital signal processor (DSP). The digital signal processing unit 405 further processes the digital I signal and Q signal from the ADC 414 and the ADC 424, and decodes/reproduces transmitted data.

As described above, in the receiver according to the present embodiment, the clock generating circuit which generates the sampling clock of the ADCs for the A/D conversion of the I signal and the Q signal is configured by the phase locked loop circuit according to any one of the first to third embodiments described above. Consequently, according to the receiver of the present embodiment, a highly accurate sampling clock with low jitter can be generated by the clock generating circuit having a smaller area and lower power consumption than heretofore.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A phase locked loop circuit which obtains an output signal coincident in frequency and phase with a target signal which is acquired by multiplying a frequency of a reference signal by a ratio represented by a sum of a first fraction and a second fraction, the circuit comprising:
a controlled oscillator including a number of annularly connected amplifiers determined by dividing a least common multiple value by an integer value, a number of multiphase signals being equal to the least common multiple, and the frequency of the multiphase signals being controlled by a digital control signal and an analog control signal, one of the multiphase signals being output as the output signal, wherein the least common multiple value is a least common multiple of a denominator of the first fraction, a denominator of the second fraction, and the integer value;
a converter which converts a frequency difference and a phase difference between the output signal and the reference signal to a first digital signal;
a digital phase frequency detector which subtracts the first digital signal from a second digital signal representing the ratio and obtains a third digital signal representing a frequency difference and a phase difference between the output signal and the target signal;
a digital filter which performs filter processing of smoothing the third digital signal to generate the digital control signal;
a signal selector which sequentially selects, from the multiphase signals at every period of the reference signal in accordance with the first digital signal, a signal in phase with the reference signal in a next period as a selected signal;
an analog phase detector which obtains an analog phase difference signal representing a phase difference between the selected signal and the reference signal;
an analog filter which performs filter processing of smoothing the analog phase difference signal to generate the analog control signal; and
a lock detector which switches signal paths for the analog control signal so that the analog control signal is provided to the controlled oscillator when the lock detector detects in accordance with the third digital signal that the output signal and the target signal are coincident in frequency and phase.

2. The circuit according to claim 1, wherein the digital phase frequency detector, the digital filter, the controlled oscillator and the converter form a first loop having a first loop band, and
the analog phase detector, the analog filter, the controlled oscillator and the selector form a second loop having a second loop band broader than the first loop band.

3. The circuit according to claim 1, wherein the amplifiers are single-phase amplifiers.

4. The circuit according to claim 1, wherein the amplifiers are differential amplifiers.

5. The circuit according to claim 1, further comprising an amplifier which amplifies the level of the analog control signal and provides a resultant analog control signal to the controlled oscillator.

6. A phase locked loop circuit which obtains an output signal coincident in frequency and phase with a target signal which is acquired by multiplying a frequency of a reference signal by a ratio represented by a sum of a first fraction and a second fraction, the circuit comprising:
a controlled oscillator including a number of annularly connected amplifiers determined by dividing a least common multiple value by an integer value, a number of multiphase signals being equal to the least common multiple, and the frequency of the multiphase signals being controlled by a digital control signal and an analog control signal, one of the multiphase signals being output as the output signal, wherein the least common multiple value is a least common multiple of a denominator of the first fraction, a denominator of the second fraction, and the integer value;
a converter which converts a frequency difference and a phase difference between the output signal and the reference signal to a first digital signal;
a digital phase frequency detector which subtracts the first digital signal from a second digital signal representing the ratio and obtains a third digital signal representing a frequency difference and a phase difference between the output signal and the target signal;
a digital filter which performs filter processing of smoothing the third digital signal to generate the digital control signal;
a signal selector which sequentially selects, from the multiphase signals at every period of the reference signal in accordance with the first digital signal, a signal in phase with the reference signal in a next period as a first selected signal, a signal whose phase is ahead the phase of the first selected signal as a second selected signal, and a signal whose phase is behind the phase of the first selected signal as a third selected signal;
an analog phase detector which obtains a first analog signal representing a phase difference between one of the second and third selected signals and the reference signal, and a second analog signal representing a phase difference between the other of the second and third selected signals and the first selected signal;
an analog filter which performs filter processing of smoothing the first analog signal and the second analog signal to generate the analog control signal; and
a lock detector which switches signal paths for the analog control signal so that the analog control signal is provided to the controlled oscillator when the lock detector detects in accordance with the third digital signal that the output signal and the target signal are coincident in frequency and phase.

7. The circuit according to claim 6, wherein the digital phase frequency detector, the digital filter, the controlled oscillator and the converter form a first loop having a first loop band, and
the analog phase detector, the analog filter, the controlled oscillator and the selector form a second loop having a second loop band broader than the first loop band.

8. The circuit according to claim 6, wherein the analog control signal is a differential signal.

9. The circuit according to claim 6, wherein the amplifiers are single-phase amplifiers.

10. The circuit according to claim 6, wherein the amplifiers are differential amplifiers.

11. The circuit according to claim 6, further comprising an amplifier which amplifies the level of the analog control signal and provides a resultant analog control signal to the controlled oscillator.

12. A receiver comprising:
a clock generator which includes the circuit according to claim 1 and which generates the output signal as a clock signal; and
an analog-digital converter which performs sampling in accordance with the clock signal.

* * * * *